United States Patent [19]

Geurts

[11] 4,349,750

[45] Sep. 14, 1982

[54] SWITCHING CIRCUIT COMPRISING A PLURALITY OF INPUT CHANNELS AND AN OUTPUT CHANNEL

[75] Inventor: Martinus F. A. M. Geurts, Nijmegen, Netherlands

[73] Assignee: U.S. Philips Corporation, New York, N.Y.

[21] Appl. No.: 111,579

[22] Filed: Jan. 14, 1980

[30] Foreign Application Priority Data

Feb. 16, 1979 [NL] Netherlands ........................ 7901270

[51] Int. Cl.³ ..................... H03K 17/30; H03K 17/60
[52] U.S. Cl. .................................. 307/243; 307/244; 307/455; 307/300
[58] Field of Search ............... 307/242, 243, 244, 241, 307/455, 300

[56] References Cited

U.S. PATENT DOCUMENTS

| | | | |
|---|---|---|---|
| 3,638,131 | 1/1972 | Sarkissian | 307/243 |
| 3,783,307 | 1/1974 | Breuer | 307/243 |
| 4,037,118 | 7/1977 | Sieborger et al. | 307/243 |

*Primary Examiner*—Stanley D. Miller, Jr.
*Assistant Examiner*—B. P. Davis

*Attorney, Agent, or Firm*—Thomas A. Briody; William J. Streeter; Laurence A. Wright

[57] ABSTRACT

A switching circuit in which one out of a plurality of input channels is connectable to an output channel via one of the switching devices in the circuit. Each of the switching devices comprises an emitter-coupled pair of transistors which have a switchable current source in the emitter lead, the base of the first and the second transistor, respectively, of each pair being connected to one of the inputs and to the output, respectively. The output channel of the circuit comprises a transistor the emitter of which is connected to the output and the base to the interconnected collectors of the second transistors, this junction point being connected to a voltage-carrying terminal via a resistor. Via a selection switch which is connected to the switchable current sources only one of the input channels can at all times be connected through to the output channel. To increase the cross-talk attenuation, the non-conducting current sources are driven to the saturated state, non-conduction being ensured by limiting the maximum and minimum value, respectively, of the input signal with respect to the current source switching voltage.

2 Claims, 1 Drawing Figure

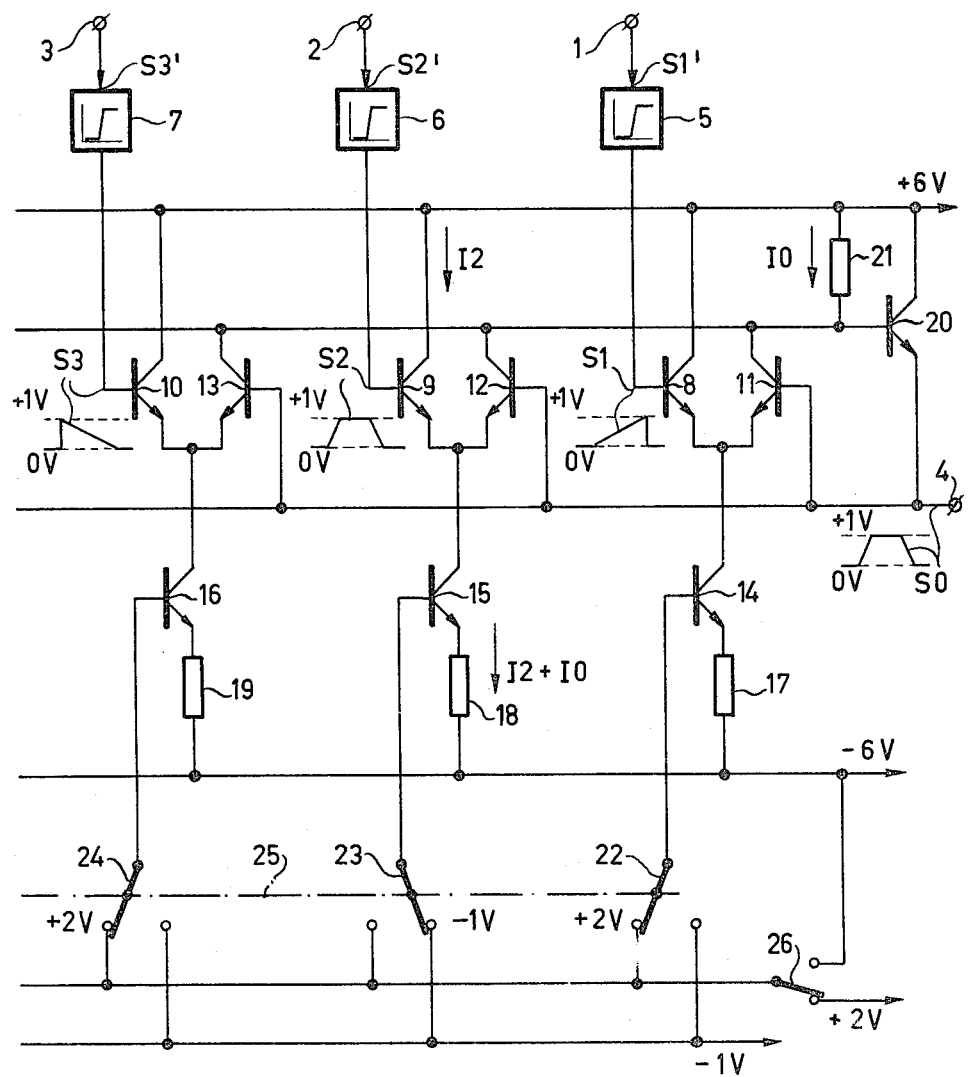

SWITCHING CIRCUIT COMPRISING A PLURALITY OF INPUT CHANNELS AND AN OUTPUT CHANNEL

The invention relates to a switching circuit comprising a plurality of input channels and an output channel, an associated switching device having been provided between the output channel and each input channel, each switching device comprising an emitter-coupled pair of transistors having a switchable transistorized current source in the emitter lead, the first and the second transistor, respectively, of each pair having its base connected to the associated input channel and to the output channel, respectively, the output channel comprising a transistor the emitter of which is connected to the output of the output channel and the base to the interconnected collectors of the said second transistors in the switching devices, the junction point being connected, via a resistor, to a voltage-carrying terminal which is further connected to the interconnected collectors of said first transistors in the switching devices, the switching circuit furthermore comprising a selection switch by means of which at all times only one of the transistorized current sources can be switched to the current-carrying state.

BACKGROUND OF THE INVENTION

Such a circuit is described in U.S. Pat. No. 3,783,307. The switching circuit is described for connecting one of a plurality of input video signals to a sole output. By means of this simple construction it is achieved that the output signal properly corresponds to the input signal to be connected through, while the further input signals cannot produce impermissible output signal distortions resulting from cross-talk.

SUMMARY OF THE INVENTION

The invention has for its object to provide a switching circuit in which a further reduction of the cross-talk is guaranteed.

A switching circuit according to the invention is characterized in that the bases of transistors which are arranged as switchable transistorized current sources are connectable, via the selection switch, to a terminal for carrying a d.c. voltage having a value at which the transistor current source can be driven to the saturated state but however, cannot carry current because the signal voltages present at the bases of said first and second transistors in the switching devices always cut off these two transistors.

The above-described measure increases the attenuation in the cross-talk as the interconnected emitters of the cut-off first and second transistors in the switching devices are connected to a low-ohmic level via the transistor-current sources which have been driven to saturation. With an operating mode wherein the transistor current sources are in the switched-off state, the said emitters are connected to a high-ohmic level so that a greater amount of cross-talk occurs owing to parasitic capacitive coupling between the base of the first transistors (input) and the base of the second transistors (output) of the switching devices.

In order to enable the optical operation with non-current carrying current sources, either by switching off these current sources or by driving them to saturation, a further embodiment of the switching circuit is characterized in that the selection switch comprises a change-over switch for applying different supply voltages to one of the selection contacts of further change-over switches, the master contacts of which are connected to the switchable current sources.

BRIEF DESCRIPTION OF THE DRAWING

The invention will be further described with reference to the accompanying drawing in which an embodiment of a switching circuit is shown by way of non-limitative example.

DETAILED DESCRIPTION OF THE PREFERRED EMBODIMENT

Reference numerals 1, 2 and 3 denote three input terminals and reference numeral 4 an output terminal of the switching circuit. In addition to the terminals 1, 2 and 3 the switching circuit comprises further input terminals, which have not been shown for simplicity. The terminals 1, 2 and 3 are connected to an input of each one of a signal clamping and limiting circuit 5, 6 and 7 which together form three input channels (1, 5), (2, 6) and (3, 7), respectively. The output of the circuits 5, 6 and 7, respectively, is connected to the base of a npn transistor 8, 9 and 10, respectively, this output carrying a signal S1, S2 and S3, respectively, shown next to them in the drawing as a function of the time, in response to the application of signals S1', S2', and S3' to the input terminals 1, 2 and 3. In the signals S1, S2 and S3, 0 V indicates a black clamping level and $+1$ V a peak-white value. The signals S1, S2 and S3 represent a schematically shown video signal, more specifically during a portion of a line period. The signal S1 represents a video signal with a gradual and linearly increasing change from black level (0 V) to the peak-white value ($+1$ V), whereafter a sudden transient to the black level (0 V) occurs. The signals S2 and S3 are shown in a similar manner with a certain variation between the black level and the peak-white value.

The emitter of the transistors 8, 9 and 10, respectively, is connected to the emitter of a npn transistor 11, 12 and 13, respectively, these interconnected emitters having been connected to the collector of a npn transistor 14, 15 and 16, respectively. Via a resistor 17, 18 and 19, respectively, the emitter of the transistors 14, 15 and 16, respectively, is connected to a supply voltage. The interconnected bases of the transistors 11, 12 and 13 are connected to the output terminal 4, which is further connected to the emitter of a npn transistor 20. The base of the transistor 20 is connected to the interconnected collectors of the transistors 11, 12 and 13 and via a resistor 21, to a terminal carrying a supply voltage of $+6$ V, to which also the collector of the transistor 20 and the interconnected collectors of the transistors 8, 9 and 10 are connected. Thus there are shown a number of switching devices (8, 11, 14, 17), (9, 12, 15, 18) and (10, 13, 16, 19), which connect the three input channels (1, 5), (2, 6) and (3, 7) to an output channel (4, 20, 21). In the manner shown in the drawing the switching device (8, 11, 14, 17) comprises an emitter-coupled pair of transistors (8, 11) and switchable transistorized current source (14, 17) included in the emitter lead thereof. The devices (9, 12, 15, 18) and (10, 13, 16, 19) are of a similar construction.

The bases of the transistors 14, 15 and 16 are connected to master contacts of three change-over switches 22, 23 and 24 respectively, which have been provided with a coupling 25, so that at all times only one of the change-over switches 22, 23 and 24 can be in one given position, which position is shown for the change-over switch 23. Switching one of the other switches 22 or 24 will result in the relevant change-over switch assuming this position and that, simultaneously, the change-over switch 23 is moved to the other position. For simplicity, the drawing shows a mechanical implementation of the switches 22, 23, 24, an electronic implementation is also possible. Corresponding selection contacts of the change-over switches 22, 23 and 24 are interconnected and are connected, in one position, to a terminal carrying a supply voltage of −1 V and in the other position to a master contact of a further change-over switch 26, which has two selection contacts which are connected to a terminal having a supply voltage of +2 V and −6 V, respectively. Thus, a selection switch (22, 23, 24, 25, 26) is formed via a voltage of −1 V applied in the position shown in the drawing to the transistor 15 and a voltage of +2 V (via the change-over switch 26) to the bases of the shown transistors 14 and 16 and to corresponding transistors (not further shown in the drawing). This results in the output terminal 4 of the switching circuit carrying the signal S0 shown next to it in the drawing, this signal corresponding with the input signal S2.

In order to explain the advantageous operation of the switching circuit, change-over switch 26 being in the position shown in the drawing, the following applies. The voltage of +2 V present at the base of the transistors 14 and 16, respectively, provides that the transistors 14 and 16 would be able to conduct if a current were applied to the collectors. As, however, the reference voltage in the signals S1 and S3 is the +1 V peak-white value, the transistors 8 and 10 to whose bases the signals S1 and S3 are applied cannot be rendered conductive. The same applies for the transistors 11 and 13, to whose bases the signal S0 having the +1 V peak-white value is applied. By way of example it holds that for a base-emitter threshold voltage of 0.7 V the +2 V at the base results in a voltage of +1.3 V at the emitter and at the collector of the transistors 14 and 16, so that the maximum +1 V at the base cannot render the transistors 8, 10, 11 and 13 conductive. The result is that the transistors 14 and 16 have been driven to saturation, so that the emitter junction points of the pairs of transistors (8, 11) and (10, 13) are at a low-ohmic level. This low-ohmic level interrupts the parasitic capacitive coupling from base to emitter to base of the transistors 8, 11 and 10, 13, respectively.

Adjusting the change-over switch 26 to the position not shown in the drawing results in the transistors 14 and 16 being cut-off by the supply of the −6 V voltage to base and emitter, so that they cannot carry current. Independent of the voltage value in the signals S0, S1 and S3 at the bases, the transistors 8, and 11, 10 and 13 will be cutoff. In this situation, however, the emitter junction point of the pairs of transistors (8, 11) and (10, 13) are at a high-ohmic level, so that the parasitic capacitive coupling from base to emitter to base of the transistors 8, 11 and 10, 13 respectively, may result in cross-talk which is either impermissible or not.

The switching circuit shown in the drawing comprises the signal clamping and limiting circuits 5, 6 and 7 to enable the obtention of the signals S1, S2 and S3 with the maximum peak-white value. When the signals S1', S2' and S3' are supplied, in which the maximum peak-white value has already been fixed, the circuits 5, 6 and 7 can be dispensed with. It further holds that when pnp transistors are used in place of the npn transistors 8 to 16, inclusive, shown in the drawing and using supply voltages adapted thereto, the 0 V black level becomes decisive as the minimum value in the signals S0, S1, S2 and S3, it being necessary that a voltage −1 V or more negative is applied to the current source transistor.

It appears that, independent of the position of the change-over switch 26 the transistors 8, 10, 11 and 13 cannot carry current when the change-over switches 22 and 24 are in the position shown in the drawing. By applying the voltage of −1 V to the base of the transistor 15 via the change-over switch 23, this transistor will conduct as a current source carrying a current I 2 + I 0. It is assumed that when a voltage of, for example, 0 V is present at the base of the transistors 9 and 12, the collector current I 2 of the transistor 9 is substantially equal to the current I 0 flowing to the resistor 21, neglecting the base currents of the transistors. In response to a positive voltage which subsequently occurs at the base of the transistor 9 a higher current I 2 is produced, the current I 0 becoming lower by the same amount. The voltage at the base of the transistor 20, which voltage is consequently more positive, renders the transistor more conductive so that the voltage in the signal S0 at the output terminal 4 increases. In response to the supply to the base of the transistor 12 this increase will continue that far that substantially the same positive voltage as that present in the signal S2 appears in the signal S0. It appears that, when the switching device (9, 12, 15, 18) is in the switched-on state the signal S0 is substantially equal to the signal S2.

For a practical construction of the switching circuit shown in the drawing it holds that half of the integrated circuit TCA 240 can be utilized for the three transistors (for example 8, 11 and 14) of each switching device (for example 8, 11, 14, 17). The resistors 17, 18, 19 etc. may then have a value of 2700 ohm, the resistor 21 having a value of 6800 Ohm. With this construction and the change-over switch 26 being in the position shown in the drawing an attenuation of the cross-talk is produced which is greater than 60 dB at 10 MHz.

What is claimed is:

1. A switching circuit comprising a plurality of input channels and an output channel, an associated switching device having been provided between the output channel and each input channel, each switching device comprising an emitter-coupled pair of transistors having a switchable transistorized current source in the emitter lead, the emitter of said transistorized current source being connected to a supply voltage through a resistance and the collector thereof connected to the emitter of said switching device, the first and the second transistor, respectively, of each pair having its base connected to the associated input channel and to the output channel, respectively, the collectors of said second transistors of each pair being interconnected, the output channel comprising a transistor the emitter of which is connected to the output of the output channel and the base to the interconnected collectors of the said second transistors in the switching devices, the junction point of said output transistor and said collectors of said second transistor of each pair being connected via a resistor to a voltage-carrying terminal which is further connected to the interconnected collectors of said first transistors in the switching devices, the switching circuit furthermore comprising a selection switch by means of which at all times only one of said transistorized current sources can be switched to the current-carrying state, said bases of said transistors which are arranged as switchable transistorized current sources are connectable via the selection switch to a terminal, for carrying a d.c. voltage having a value at which the transistorized current source can be driven to the saturated state but can, however, not carry current because the signal voltages present at the base of said first and second transistors in the switching devices always cut-off these two transistors.

2. A switching circuit as claimed in claim 1, characterized in that the selection switch comprises a change-over switch for applying different supply voltages to one of the selection contacts of further change-over switches, the master contacts of which are connected to the switchable current source.

* * * * *